United States Patent [19]

Bujese

[11] Patent Number: 4,968,570
[45] Date of Patent: Nov. 6, 1990

[54] METHOD OF PREPARING A PERMANENT MASTER WITH A PERMANENT LATENT IMAGE FOR USE IN ELECTROSTATIC TRANSFER

[75] Inventor: David P. Bujese, Butler, N.J.

[73] Assignee: Olin Corporation, Cheshire, Conn.

[21] Appl. No.: 426,122

[22] Filed: Nov. 20, 1989

Related U.S. Application Data

[63] Continuation-in-part of Ser. No. 144,743, Jan. 19, 1988, which is a continuation of Ser. No. 884,847, Jul. 11, 1986, abandoned, which is a continuation-in-part of Ser. No. 848,669, Apr. 4, 1986, Pat. No. 4,661,431, which is a continuation-in-part of Ser. No. 655,346, Sep. 27, 1984, abandoned.

[51] Int. Cl.⁵ ............................................. G03G 13/28
[52] U.S. Cl. ........................................ 430/49; 430/54; 430/126; 430/306; 427/14.1
[58] Field of Search .................... 430/49, 54; 427/14.1

[56] References Cited

U.S. PATENT DOCUMENTS

| 29,357 | 8/1977 | Bickmore et al. | 430/491 |
| 3,286,025 | 11/1966 | Ingersoll | 178/6.6 |
| 3,515,584 | 6/1970 | Yang | 430/33 |
| 3,558,307 | 1/1971 | Carlson | 430/31 X |
| 4,732,831 | 3/1988 | Riesenfeld et al. | 430/49 |

*Primary Examiner*—J. David Welsh
*Attorney, Agent, or Firm*—Ralph D'Alessandro

[57] ABSTRACT

A method of preparing a permanent photopolymer master with a permanent latent image for use in electrostatic image transfer to a receiving substrate is provided in which the photopolymer master is first flood pre-exposed to increase the resistivity of the entire photopolymer material and then is selectively exposed for a second time to form the permanent latent image in areas of high resistivity and to leave the background areas of the photopolymer with lower resistivity.

22 Claims, 2 Drawing Sheets

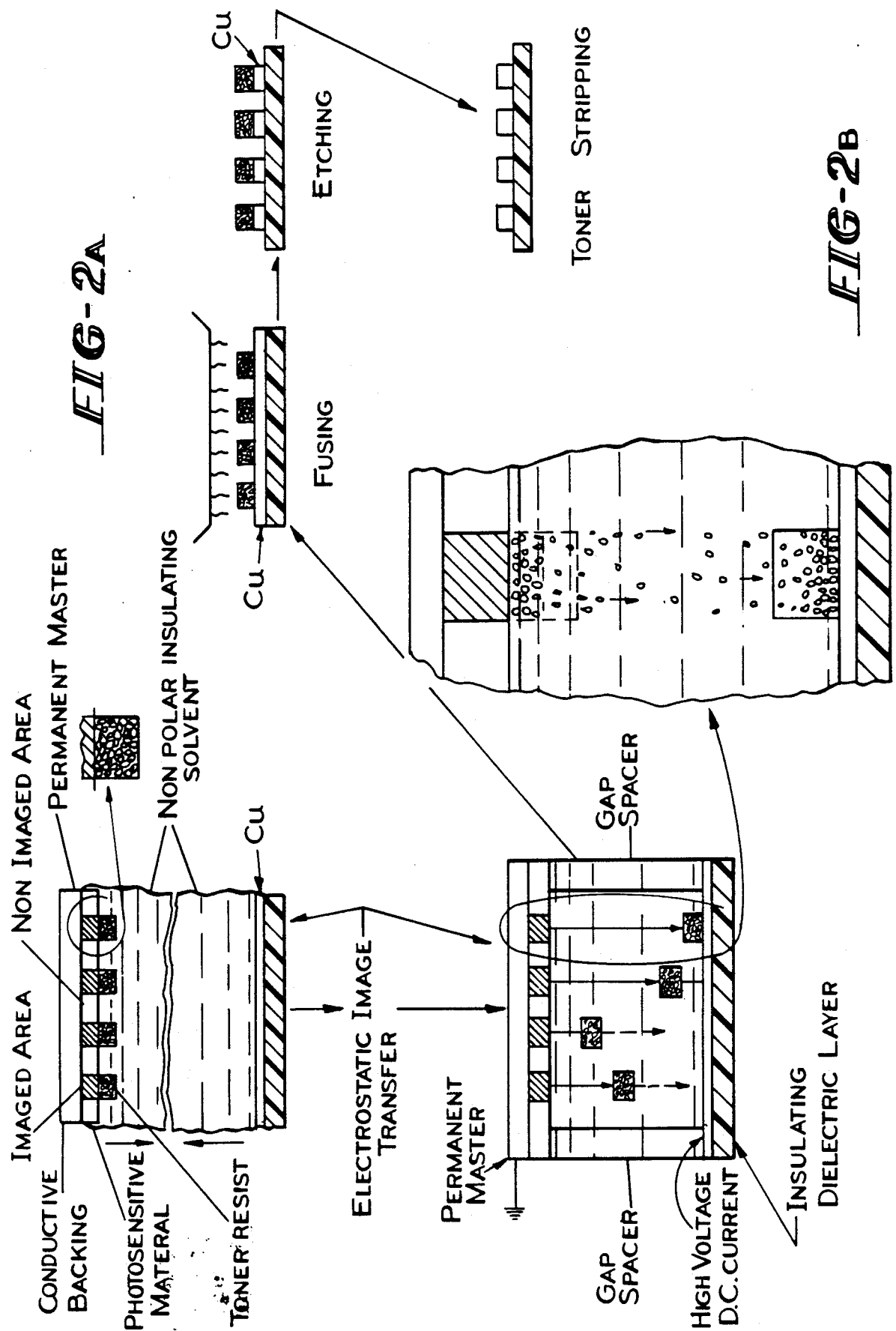

METHOD OF PREPARING A PERMANENT MASTER WITH A PERMANENT LATENT IMAGE FOR USE IN ELECTROSTATIC TRANSFER

This application is a continuation-in-part of application Ser. No. 144,743 filed Jan. 19, 1988, which is a continuation of application Ser. No. 884,847 filed July 11, 1986, now abandoned, which is a continuation-in-part of application Ser. No. 848,669 filed Apr. 4, 1986, now U.S. Pat. No. 4,661,431; which is a continuation-in-part of application Ser. No. 655,346, filed Sept. 27, 1984, now abandoned.

BACKGROUND OF THE INVENTION

This invention relates generally to a method of preparing a permanent master with a permanent latent image for use in electrostatic image transfer to a receiving substrate. More specifically, it pertains to a method of adjusting the conductivity of unexposed regions of a photopolymer so that fine image structure may be charged, developed and electrostatically transferred.

The use of an electrostatic printing plate or master employing a photopolymerizable composition has recently been developed for use in xeroprinting electrostatic transfer U.S. Pat. No. 4,732,831 to Riesenfeld et al discloses the use of special photopolymer compositions specifically designed or tailored to have excellent charge retention and charge decay characteristics that are also resistant to hydrocarbon solvents and are compatible with liquid toners. Riesenfeld designed specific formulations for use as a photopolymer master, but did not address the issue of utilizing existing photopolymer materials that were too conductive.

Another similar approach was taken in U.S. Pat. No. 3,286,025 to Ingersoll with a photopolymer material that used polymerized areas of reduced conductivity which could be corona charged on a conductive support and toned to form a toner image. This approach utilized the plate to store information, but required the washing out of non-imaged areas with a solvent. No transfer was involved in the Ingersoll approach. Ingersoll did involve a photopolymer that increased in resistivity or decreased in conductivity in the exposed areas.

Electrostatic master systems employing photopolymer materials which are exposed to actinic radiation to create the latent image have suffered from the problem of the variability in conductivity of the photopolymer material. This is especially a problem where fine line or fine image structure is required. The exposed areas will hold charge well and retain it for many seconds. However, unexposed regions of highly conductive photopolymers are so conductive that they cannot be charged to any significant value. This has been described as the "island effect" with regard to fine image structure. The island effect involves charge accumulation on fine lines or fine image structure, for example a 50 micron wide line in a background of relatively conductive unexposed photopolymer. The surface charge will initially accumulate in the fine image structure, but the electric fields parallel to the surface of the fine image structure will repel further charge and prevent sufficient charge from building up in the image structure to attract toner particles during the development stage.

This problem is solved in the method of the instant invention where intrinsincally conductive photopolymers are exposed in a step-wise fashion to make the background regions more resistive (less conductive) to permit fine image structure to be charged and subsequently developed and transferred.

SUMMARY OF THE INVENTION

It is an object of the present invention to provide a method for preparing a permanent photopolymer master with a permanent latent image for use in electrostatic transfer.

It is another object of the present invention to provide a method that reduces the conductivity or increases the baseline resistivity in the unexposed or background regions of the photopolymer to permit fine line or fine image structure to be charged and developed.

It is a feature of the present invention that a photopolymer material can be used as a permanent master in an electrostatic transfer process by step-wise exposure to have its resistivity (conductivity) adjusted to obtain a suitable charged decay time constant.

It is another feature of the present invention that a photopolymer master material is pre-exposed in a flood pattern to bring the resistivity of the entire photopolymer to a higher level prior to the final selective exposure which forms the desired latent image.

It is an advantage of the present invention that commercially available photopolymers may be employed as permanent masters in electrostatic transfer despite the intrinsically high conductivity of the material.

These and other objects, features and advantages are obtained by the use of a pre-exposure or pre-fogging technique in blanket fashion to increase the resistivity of the entire photopolymer prior to latent image exposure, charging and development with toner.

BRIEF DESCRIPTION OF THE DRAWINGS

The objects, features and advantages of the invention will become apparent upon consideration of the following detailed disclosure of the invention, especially when it is taken in conjunction with the accompanying drawings wherein:

FIG. 2a & b is a diagrammatic illustration of the process of the present invention employing a permanent master that is reusable to produce multiple copies of a desired conductive wiring pattern on an insulating dielectric layer by the migration of charged toner particles from the master across a liquid-filled gap to a conductive receiving surface.

DETAILED DESCRIPTION OF THE PREFERRED EMBODIMENT

Figure 1:
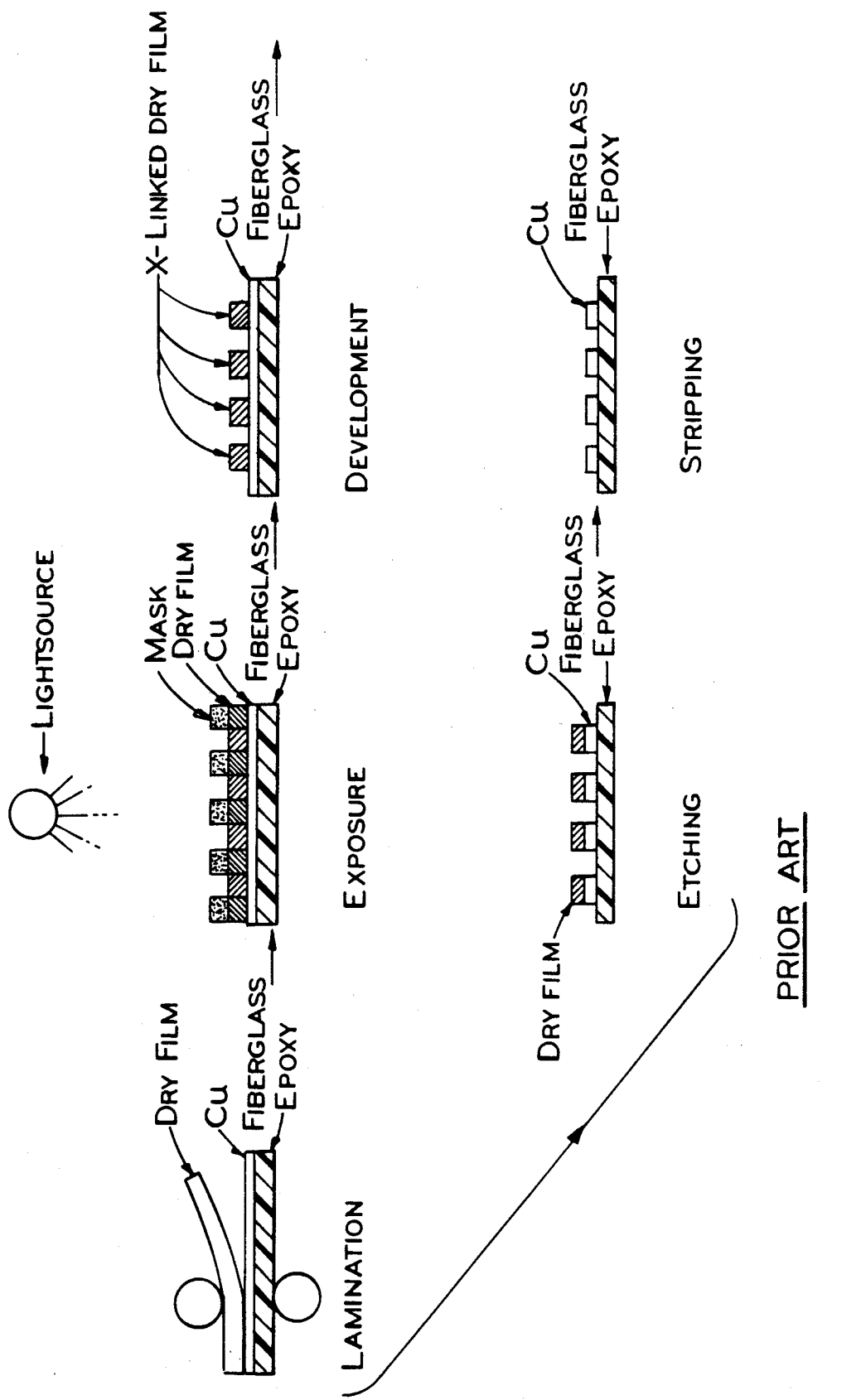
FIG. 1 is a diagrammatic illustration of the prior art print and etch printed circuit board fabrication steps.

FIG. 1 shows the standard five step process that has been previously employed in the production of printed circuit boards. Each one of the circuit boards produced has routinely required the application of a dry film to a conductive substrate, such as copper, that is laminated to a nonconductive substrate, such as fiberglass epoxy, with pressure and heat. A mask is then applied over the dry film to permit selective exposure from a light source or other source of actinic radiation to produce the desired pattern. Development takes place by removing the uncross-linked dry film, leaving only cross-linked dry film with the desired pattern. Etching with an acid etchant removes the conductive copper substrate from between the areas of cross-linked dry film. Finally, stripping the dry film from the remaining conductive copper substrate exposes the desired circuit pattern. This is commonly known as the print and etch process.

In the process of the present invention, however, a permanent master is produced with the use of a photopolymer material or coating, such as a dry film or liquid photoresist over a conductive substrate. Thereafter, dry film or liquid photoresist is not employed to produce the desired conductive wiring patterns from the permanent master on the product circuit boards. The permanent master can also be employed to transfer desired patterns to paper, color proofing paper or other nonconductive substrates in a xeroprinting process.

The permanent master is used as an electrostatically imageable surface as shown in FIG. 2. A conductive backing has a photopolymer material, such as a dry film or liquid photoresist, applied to it on at least one side. This photopolymer material undergoes a change in resistivity upon exposure to actinic radiation because of the cross-linking of the polymers in the material. A permanent image is formed on the photopolymer material by actinicly radiating through a mask or by "writing" the desired pattern with a digital laser pen. Either method produces electrostatic contrasts or differences in the resistivity between imaged and non-imaged areas on the photopolymer material. The electrostatically imageable surface is isolated from ground and charged with a corona charging device to produce the charged latent image.

The electrostatically imageable surface is then developed by the application, through surface adsorption, of a liquid comprised at least partially of a nonpolar insulating solvent that serves as a liquid carrier for toner particles that are charged oppositely to the charge of the electrostatically imageable surface. This application can be accomplished by flooding, dipping or spraying the electrostatically imageable surface. The charged toner particles are directed to the latent image area of the electrostaically imageable surface to form or develop the latent image.

Thus developed, the image is formed on the electrostatically imageable surface according to the permanenet latent images's pattern on the permanent master. The developed image thus is ready for transfer to an electrically isolated conductive or nonconductive receiving surface to produce the desired pattern.

Preferably, the receiving surface is first coated with a liquid that comprises at least partially a nonpolar insulating solvent. The solvent is the same as, or an equivalent to that which is applied to the electrostatically imageable surface and may be applied by sponge, squegee, rubber roller or other means capable of applying a thin continuous film. The solvent should preferably have a high resistivity and a low viscosity to permit the charged toner particles to migrate or flow through the solvent from the charged electrostatic latent image area on the electrostatically imageable surface to the conductive receiving surface. The solvents are generally mixtures of $c_9$–$C_{11}$ or $C_9$–$C_{12}$ branched aliphatic hydrocarbons sold under the tradename Isopar G and Isopar H, respectively, manufactured by the Exxon Corporation, or equivalents thereof. The electrical resistivity is preferably on the order of at least about $10^9$ ohm-centimeters and the dielectric constant preferably is less than about $3\frac{1}{2}$. The use of nonpolar insulating solvents with these characteristics helps to ensure that the pattern of charged toner particles is not dissipated.

After a D.C. voltage, optimally between about 200 to about 1200 volts, is applied to the receiving surface to establish an electric field between the electrostatically imageable surface and the receiving surface, the surfaces are moved close enough together to create a completely liquid transfer medium by the contact of the two layers of nonpolar insulating solvent. The first liquid surface of the first layer of nonpolar insulating solvent on the electrostatically imageable surface and the second liquid surface of the second layer of nonpolar insulating solvent on the receiving surface join together to fill the gap between the two surfaces. The voltage necessary to establish the electric field between the electrostatically imageable surface and the receiving surface operably can be between about 200 to about 3500 volts, but is preferably between about 200 and about 1500 volts, and optimally is as stated above. The ability to transfer a high resolution image is a function of the combined factors of the toner, the liquid carrier, the gap spacing and the voltage applied. Generally, a greater gap spacing requires a higher voltage to effect a high quality, high resolution image transfer.

A uniform spacing across this gap is maintained by the use of spacer strips or gap spacers, seen in FIG. 2, which are electrically isolated from ground. The developed image from the electrostatically imageable surface is transferred across the gap through the liquid medium to the conductive surface to form an imaged area in a pattern similar to that of the phototool where the transferred toner particles are present and non-imaged areas where the particles are absent.

The transfer of the developed image across the liquid-filled gap takes place at the point of transfer by maintaining a first plane taken through the electrostatically imageable surface parallel to a second plane taken through the receiving surface. The electrostatically imageable surface and the receiving surface at the point of transfer should have no relative motion occurring between them, although the point of transfer could be a stationary or rolling point of transfer. A drum or web, or a stationary flat surface could be employed for the electrostatically imageable surface, transferring the developed image across the gap to a flat and stationary, or a moving receiving surface. The moving conductive receiving surface could be a rolling drum or a web or other appropriate means. The electrostatically imageable and receiving surfaces must be held in place at the point of transfer, such as by a vacuum, or alternately could be accomplished by magnetically or electrostatically holding the surfaces in place across the gap.

This gap between the electrostatically imageable surface and the receiving surface is preferably maintained between at least about 3 mils (0.003 inch) and about 10 mils (0.010 inch) by the use of spacer strips of the desired thickness. By maintaining the gap greater than about 3 mils, the inconsistencies or irregularities in the two surfaces are separated sufficiently to prevent any contact from occurring between the two surfaces and any possible abrasion or scratching from occurring to the surface of the master or electrostatically imageable surface.

The spacer strips or gap spacers maybe selected from either conductive materials, such as metal, or nonconductive materials, such as polyester film sold under the tradename MYLAR, or cellophane. The strips must be electrically isolated from ground and be of uniform thickness. The uniform thickness insures the a uniform gap spacing is obtained between the electrostatically imageable surface and the conductive receiving surface.

The spacer strips preferably should be placed outside of the image area.

By applying the first and second layers of nonpolar insulating solvent in sufficient thickness to the electrostatically imageable surface and the receiving surface to fill the gap there between, the first liquid surface and the second liquid surface of the first and second layers of the nonpolar insulating solvent join together to form a continuous liquid transfer medium at the point of transfer of the charged toner particles between the electrostatically imageable surface and the conductive receiving surface. By traveling through a continuous sea of liquid transfer medium, there are no surface tension forces which the charged toner particles must overcome that could hinder their migration from the electrostatically imageable surface to the receiving surface. The charged toner particles are directed through the liquid transfer medium formed by the joining of the two layers of nonpolar insulating solvent at this point of transfer by the electric field that is applied at the point of tranfer.

As is diagrammatically illustrated in FIG. 2, the charged toner particles with their predetermined charge, migrate from the oppositely charged cross-linked imaged area with the photopolymer material on the electrostatically imageable surface to the receiving surface as individual or grouped particles. The receiving surface is laminated onto an insulating dielectric layer, such as a fiberglass epoxy. The applied electric transfer field causes the toner particles to migrate through the liquid transfer medium of the nonpolar insulating solvent and attach to the receiving surface to create imaged areas where the toner particles are present and non-imaged areas where they are absent.

Since the photopolymer material, such as a dry film or liquid photoresist, on the electrostatically imageable surface acts as a master electrostatic image plate, and the resistivity difference between the imaged and non-imaged areas on the electrostatically imageable surface remains relatively constant in most instances for sustained periods of time dependent upon the photoresist used, multiple copies can be made by the electrostatic transfer method. To repeat the procedure, excess nonpolar insulating solvent and excess toner particles on the electrostatically imageable surface should be removed, such as by rinsing, followed by a physical wiping or squeeging. Any residual electric charge on the electrostatically imageable area should be discharged, such as by charging the photopolymer material's surface with an alternating current corona.

The desired electrostatic latent image pattern remains in the photopolymer material by using the material's ability to retain differences in resistivity for relatively long periods of time after having been exposed to actinic radiation to form cross-linked imaged areas of increased resistivity and non-imaged areas unexposed to the actinic radiation which remain the less resistive or background areas. The photopolymer material, such as a dry film resist, typically is formed of polymers which become cross-linked to form the imaged areas of greater electrical resistivity that should be an order of magnitude, or greater, more dielectric than the background or unexposed areas, dependent upon the process speed of the image transfer. Faster process speeds will require greater resistivity differentials.

For fine line image transfer the resistivity of the exposed photopolymer material in the exposed image area can range between about $10^{17}$ to $10^{15}$ ohm-centimeters.

The background or non-imaged areas should typically have an electrical resistivity of greater than about $10^{12}$ ohm-centimeters. For photopolymers with lower electrical resistivity, the resistivity must be increased across the entire material by an appropriate process such as blanket or flood pre-exposure. For comparative purposes, the resistivity of various materials, including some traditionally considered as insulating materials, are known. Electronic grade Mylar polyester film has a resistivity of about $10^{17}$ ohm-centimeters, aluminum oxide ceramic about $10^{16}$ ohm-centimeters, various grades of mica from $10^{13}$ to $10^{17}$ ohm-centimeters, unexposed Dynachem AX dry film about $10^{13}$ ohm-centimeters, and various grades of Union Carbide's Bakelite copolymer plastics from about $10^7$ to $10^{16}$ ohm-centimeters. DuPont's Riston 3615 dry film has a resistivity of about $10^{10}$ ohm-centimeters.

These imaged areas, formed by the exposure of the photopolymer material to actinic radiation, are the only areas of increased resistivity that hold a high voltage charge when charged by a D.C. charging corona, if the conductive backing is electrically grounded. The non-imaged or background areas with the lesser electrical resistivity very rapidly release or leak the charge through the grounded conductive backing. The charged toner particles suspended in the nonpolar insulating solvent are oppositely charged to these corona charged latent imaged areas so that the charged toner particles are attracted to them. This then permits the subsequent transfer of these charged toner particles from the developed image on the electrostatically imageable surface across the liquid gap to the receiving surface as previously described.

Where the photopolymers are intrinsically too conductive, such as DuPont Riston 1215 and BASF WN-0038 dry film photoresist, the exposure step and charging creates problems for fine line or fine image structure. The exposed areas in photopolymers that are intrinsically too conductive hold the charge well and retain it for many seconds, but the unexposed regions are so conductive that they cannot be charged to any significant value without an initial pre-fogging step. The pre-fogging increases the resistivity of the entire plate due to the blanket nature of the fogging, but those areas that are not exposed, that is the background areas of the photopolymer, have their resistivity increased to a level such that the charge decay time constant is sufficient to allow a charge to build up in the exposed fine line or imaged areas. A typical pre-fogging step will increase the electrical resistivity of the entire photopolymer to about $10^{13}$ ohm-centimeters. This is generally the desired resistivity level in the background or unexposed areas of the photopolymer master. The final selective exposure step to form the permanent latent image in the exposed areas of the photopolymer increases the resistivity in the exposed areas to about $10^{15}$ to about $10^{16}$ ohm-centimeters.

Various photopolymers that require pre-fogging exist. These include aqueous developable types commercially available as Hercules Aqua Mer LR, BASF WN-0038, and DuPont Riston 3615. DuPont Riston 1215 solvent developable dry film also requires pre-fogging. Examples of these photopolymers used under their commercially available name and the pre-fogging steps involved to obtain the necessary decay time constant are shown on the attached Table 1. The two listed semiaqueous developable dry film photopolymers were not so conductive as to require pre-fogging. The thickness is given in microns.

TABLE 1

| | THICKNESS | PREFOG* (SEC.) | EXPOSURE*(SEC.) | EXPOSED FILM INITIAL V | ΔV IN 8 SEC | UNEXPOSED FILM INITIAL | DECAY TIME CONSTANT |
|---|---|---|---|---|---|---|---|
| SEMIAQUEOUS | | | | | | | |
| DynaChem AX | 38 | 0 | 60 | 1050 V | 32 V | 700–800 | 0.8 SEC. |
| Dupont 215 | 38 | 0 | 60 | 900 V | 70 V | 500–600 | 0.8 SEC. |
| AQUEOUS | | | | | | | |
| Hercules LR | 38 | 0 | 20–30 | 1100 V | 130 V | 650 V | 1.7 SEC. |
| Dupont 3615 | 38 | 5 | 115 | 1050 V | 140 V | 800 V | 3.0 SEC. |
| Basf WN-0038 | 38 | 5 | 90 | 900 V | 260 V | 300 V | 0.6 SEC. |
| SOLVENT | | | | | | | |
| Dupont 1215 | 38 | 1.5 | 30 | 900 V | 80 V | 370 V | 0.7 SEC. |

NOTE:
FOR AMBIENT CONDITIONS 70°, 25% R.H.
*Exposure on Addalux Model 1421-40 Manufactured by Berkeley Technical Corporation Once the toner image is formed by the toner particles in the imaged area on a receiver surface, the particles are fused to the receiving surface by heating, as illustrated diagrammatically in FIG. 2. The heat can be provided either by the use of an oven or directed warm air through an air slot so that the heat is supplied for a finite period of time sufficient to reach the temperature at which the binder or polymer forming the toner particles will solvate in the liquid which is entrained within the transferred image. The fusing, for example, can occur for about 15 to about 20 seconds at a temperature greater than about 100° C. and up to about 180° C.

Thereafter the non-imaged areas are etched in the instance of a printed wiring board, for example, to produce the desired pattern in the unetched receiver surface which is overcoated with the toner particles. The etching step utilizes a solution that cannot remove the conductor material from the areas of the receiving surface protected by the toner particles, but does attack and remove the conductor material from the areas unprotected by the toner particles. The particular type of etchant employed depends, in part, on the conductor material being etched and the type of resist being used, so that both acid and very mild alkaline etching solutions are possible for use. For example, when the receiving surface is copper, an etchant comprising acidic cupric chloride is preferably used.

The final step in the electrostatic transfer process to form the copy on a printed circuit board is the stripping step. During this step the toner particles are appropriately removed or stripped from the imaged areas, such as by rinsing with methylene chloride, acetone, an alkaline aqueous solution or other suitable solution.

In order to exemplify the results achieved, the following examples are provided without any intent to limit the scope of the instant invention to the discussion therein. The examples are intended to illustrate the manner in which a photopolymer permanent master which normally would be too conductive to accomplish successful charging and development of a permanent latent image with fine line or fine image structure on the electrostatically imageable surface can be obtained and how successful electrostatic image transfer can occur.

A liquid toner was prepared for use by preparing the following raw materials in the amounts shown in a high speed disperser:

| Raw Material | Amount (grams) | Description |
|---|---|---|
| ISOPAR H | 1248.6 | solvent-carrier |
| UNIREZ 7059 (Union Camp) | 439.2 | alcohol insoluable maleic modified rosin ester |
| Allied AC Polyethylene 6A | 307.8 | linear polyethylene |
| BAKELITE DPD 6169 (Union Carbide) | 1584.0 | ethylene-ethylacrylate copolymer 20 shock-cooled suspension in ISOPAR H |
| Phthalocyanine green | 229.2 | coloring agent - pigment |
| Alkali Blue G | 158.4 | coloring agent - pigment |

These components were mixed at a speed of 8000 rpm for 10 minutes while maintaining the temperature of the mixture between 160° and 220° F.

606 grams of an amphipathic graft copolymer system was prepared by mixing 104.3 grams of lauryl methacrylate and 44.7 grams of methyl methacrylate, both available from Rohm and Haas, and 3.0 grams of azobis isobutonitrile, available from DuPont as Vazo 64.

Next 108.2 grams of an amphipathic copolymer stabilizer was prepared according to the procedure described hereafter. In a 1 liter reaction flask equipped with a stirrer, a thermometer and a reflux condensor is placed 400 grams of petroleum ether (b.p. 90°–120° C.) and the same is the heated at atmospheric pressure to a moderate rate of reflux. A solution is made of 194 grams lauryl methacrylate, 6.0 grams of glycidyl methacrylate and 3.0 grams of benzoyl peroxide paste (60 percent by wt. in dioctyl phthalate) and placed in a 250 ml. dropping funnel attached to the reflux condensor. The monomer mixture is allowed to drip into the refluxing solvent at such a rate that it requires 3 hours for the total amount to be added. After refluxing 40 minutes at atmospheric pressure beyond the final addition of monomer, 0.5 grams of lauryl dimethyl amine is added and the refluxing is continued at atmospheric pressure for another hour. Then 0.1 gram hydroquinone and 3.0 grams methacrylic acid are added and refluxing continued under a nitrogen blanket until about 52 percent esterification of the glycidyl groups is effected (about 16 hours). The resulting product is slightly viscous straw-colored liquid.

345.8 grams of ISOPAR H from Exxon Corporation was added to the 108.2 grams of the amphipathic copolymer stabilizer and the aforementioned quantities of lauryl methacrylate, methyl methacrylate and azobis isobutnitrile to form the 606 grams of amphipathic graft copolymer system. Polymerization was affected by heating this solution to about 158° F. under a nitrogen atmosphere for about 4 to about 20 hours.

606 grams of additional ISOPAR H was added to the above solution and mixing was continued for 10 minutes at 8000 RPM while the temperature was maintained between about 160° F. and 180° F.

Finally, 3578 grams of ISOPAR H was added, the mixer speed reduced to 1000-2000 RPM, and mixing continued for 30 minutes. During this last step, the temperature of the mixture was maintained between 120° F. and 140° F.

Next a liquid toner concentrate was prepared by combining the following in a static attritor-type mill:

| Material | Amount (grams) | Description |
|---|---|---|
| Predispersion Mix | 1022.7 | liquid toner predispersion |
| Carnauba wax | 58.3 | wax |
| polymer dispersion | 83.3 | amphipathic Polymer dispersion as prepared in Ex. XI of Kosel U.S. Pat. No. 3,900,412 |
| Neocryl S-1004 | 62.4 | amphipathic polymer dispersion available from Polyvinyl Chemical Industries, Div. of Beatrice, 730 Main St. Wilmington, MA 01887 |
| ISOPAR H | 694.5 | solvent-carrier |

These components were milled for three hours at 300 RPM and a temperature of about 75° F. to create a toner concentrate. The toner concentrate was further diluted to about 1 to about 2 percent solids to create the working solution for use in electrostatic imaging.

EXAMPLE 1

A 4"×5" electrically conductive substrate of copper was mounted on a glass epoxy support substrate known as FR 4. The conductive surface of the laminate was checked to ensure that it was clean and not in need of degreasing. If necessary, the substrate can be cleaned with methyl chloride, methylene chloride or trichloroethylene to promote good adhesion of the photoresist to the cleaned surface during the subsequent lamination step. In this particular instance cleaning was not necessary. DuPont Riston 3615 dry film photoresist was laminated to the surface, using the Western Magnum Model XRL-360 run at a speed of six feet per minute and a roll temperature of about 220° F. A protective top layer of approximately 0.001 inch thick PET film was retained over the dry film photoresist of the copper/Riston 3615 laminate.

After allowing the laminate to cool to room temperature for about 10 to 15 minutes the dry film was exposed in two steps to actinic radiation to a negative phototool. A pre-fogging for about five seconds by an AD-DALUX Model 1421-40 unit, produced by Berkeley Technical Corporation of Woodside, N.Y. was accomplished at an energy level of about 25 millijoules. The second step of the exposure process involved exposing the negative phototool and the electrostatically imageable surface to an energy level of approximately 475 millijoules or an exposure time of about 55 seconds. The negative phototool was a Microcopy Test Target T-10 resolution test chart sold by Applied Image, Inc. of Rochester, N.Y. The bar groups on the phototool varied the line pairs from 1.0 cycles or line pairs per millimeter to 18 line pairs per millimeter.

The exposed electrostatically imageable surface was then allowed to cool to room temperature for about 30 minutes, thereby permitting cross-linking in the dry film to complete. The protective layer of PET film was peeled away. The copper substrate was grounded and the electrostatically imageable surface was corona charged so that the imaged area received a positive charge. After a short delay of about a second or more to allow background areas to discharge, the charged persistent image was then electrophotographically developed with liquid toner of Example 1. Excess toner particles were rinsed from the developed permanent master with Isopar H solvent carrier without allowing the toner to dry. The developed persistent image on the electrostatic master was then ready for transfer to a conductive receiving surface.

The electrostatic master thus formed was laid flat on a generally flat working surface. Two three (03) mil thick MYLAR polyester spacer strips were placed along a pair of parallel and opposing edges of the master outside of the developed image area.

A flexible conductive receiving surface of ½ ounce copper foil laminated to a 1 mil thick Kapton polyimide insulating layer was wrapped around and secured by lap taping the edges to a 1½ inch diameter drum. The receiving surface was wet with a layer of Isopar H solvent carrier by immersing the cylinder. Alternatively, the receiving surface could be coated by pouring the liquid thereover.

An electrical potential of about 800 volts was established to create an electric field across an approximately 3 mil gap. The conductive receiving surface of copper foil was charged with positive polarity with respect to the electrically conductive copper substrate of the master for use with the negatively charged toner particles.

The 1½ inch diameter drum with the conductive receiving surface secured thereto was rolled over the spacer strips on the edges of the master. As the roller passed over the master at each discrete point of transfer the toner particles were transferred from the master to the conductive receiving surface.

The conductive receiving surface was then exposed to a fan for up to about 30 seconds to dry the non-imaged areas that comprise the background areas. The non-imaged areas should be dried while the imaged areas remain wet so the polymers in the toner particles can solvate in the solvent carrier and not run outside of the imaged areas. An air knife can also be used to effect the drying of the non-imaged areas.

The transferred image on the conductive receiving surface was then fused by placing in an oven for about 30 seconds. The temperature of the oven prior to opening was about 180° C. The fusing is accomplished through a temperature ramping that effectively occurs when the oven door is opened to place the conductive receiving surface inside because of the resultant temperature drop within the oven. The oven temperature gradually increases to the approximate 180° C. temperature level after the oven door is closed again.

COMPARATIVE EXAMPLE A

The same procedure as in Example 1 was followed, but the DuPont Riston 3615 dry film photoresist was not pre-fogged prior to use of the negative phototool in the exposure step. The fine line structure in the latent image for approximately 15 to 18 line pairs per millimeter did not hold a charge for a sufficiently long time to permit the fine line area to be developed. Subsequent transfer to the conductive receiving surface yielded no transferred image in the fine line area.

Measurement of the unexposed or background areas of the photoresist with a Monroe Model 244 proximity voltmeter showed no discernible voltage buildup.

While the preferred method in which the principles of the present invention have been incorporated is shown and described above, it is to be understood that the present invention is not to be limited to the particular details or methods thus presented, but, in fact, widely different means and methods may be employed in the practice of the broader aspects of this invention. All patent applications, patents and other publications cited in this disclosure are incorporated by reference in their entirety.

For example to effect transfer, the electric field established between the electrostatically imageable surface and the conductive receiving surface can be charged with either positive or negative polarity, depending upon the charge of the toner particles, to direct the charged toner particles across the liquid medium. Charged toner particles of negative polarity will be attracted to a positively charged conductive receiving surface or will be repelled by a negative back charging of the electrostatically imageable surface. If charged toner particles of positive polarity are used, they will be attracted to a negatively charged conductive receiving surface or repelled by a positive back charging of the electrostatically imageable surface.

Similarly, in the development of the electrostatically imageable master surface, alternate methods can be used. Negatively charged toner particles will be atrracted to a positively charged latent image or vice versa. In the instance of reversal development where the background areas are exposed, the desired image areas on the electrostatically imageable surface will be uncharged and the surrounding non-image areas will be charged the same as the toner particles to cause the charged toner particles to be repelled from the non-image areas onto the desired image area. Also, the non-polar insulating solvent can equally well be mineral spirits, as long as it possesses high resistivity and low viscosity.

The gap spacing can equally well employ a web-to-web arrangement that will hold the electrostatically imageable surface and the conductive receiving surface at the desired distance.

The electric field can be established in several ways. For example, with a conductive receiving surface, such as the copper laminate, or in the case of a dielectric material, such as MYLAR polyester film backed by a conductive surface, the electric field is created by direct charging. Where a dielectric receiving surface, such as MYLAR polyester film, is used front or back charging via conventional corona charging or roller charging can be employed.

The type of photopolymer material applied to the conductive backing to make the permanent master may vary as long as it is permanently imageable and possesses the correct resistivity characteristics or is capable of being modified by pre-fogging to the proper background resistivities. For example, where dry film resists are used, the films may be aqueous, semi-aqueous or solvent based.

The process disclosed herein has been discussed in the context of producing printed circuit boards. It should be noted, however, that the electrostatic image transfer process from a permanent master is equally well acceptable for use in the production of labels, high speed production of documents, including the production of color copies or color proofs, and photochemical machining or milling. The permanent master can be employed with liquid or dry toners. Dry toners can be applied to the photosensitive material that is used to make the permanent master by magnetic brush, particle cascade or particle bed systems.

The scope of the appended claims is intended to encompass all obvious changes in the details, materials and arrangements of parts which will occur to one of skill in the art upon a reading of the disclosure. For example, it is possible to expose just the background area of the photopolymer material in the first exposure step, instead of blanket exposing or pre-fogging the entire photopolymer material. It may also be possible, under certain circumstances, to image-wise expose the photopolymer material first and than do the "pre-fogging" step of the photopolymer material.

Having thus described the invention, what is claimed is:

1. A method of making a permanent master with a permanent latent image for use in repeated electrostatic image transfer to receiving surfaces, comprising the steps of:
   (a) coating an electrically isolated conductive substrate with a photopolymer material that will undergo an increase in resistivity upon exposure to a source of actinic radiation, thereby forming an electrostatically imageable surface;
   (b) exposing at least the background or non-imaged areas of the photopolymer material to actinic radiation for a first time to increase the resistivity of the photopolymer material;
   (c) forming a permanent latent image in the photopolymer material by exposing selective portions of the photopolymer material a second time to actinic radiation to form non-imaged areas of lesser electrical resistivity and a latent image area of higher electrical resistivity corresponding to the selective portions exposed the second time; and
   (d) charging the electrostatically imageable surface to form electrostatically contrasted non-imaged areas and a latent image area corresponding respectively to the non-imaged areas of less electrical resistivity and the latent image area of higher electrical resistivity.

2. The method according to claim 1 further comprising using a dry film photoresist as the photopolymer material.

3. The method according to claim 1 further comprising using a liquid photoresist as the photopolymer material.

4. The method according to claim 1 further comprising mounting the conductive substrate to a flexible dielectric material.

5. The method according to claim 1 further comprising mounting the conductive substrate to a rigid dielectric material.

6. The method according to claim 1 further comprising increasing the electrical resistivity of the photopolymer to about $10^{13}$ ohm centimeters by the exposure to actinic radiation for the first time.

7. The method according to claim 6 further comprising increasing the electrical resistivity of the photopolymer in the latent image area to about $10^{15}$ to about $10^{16}$ ohm centimeters by the selective exposure of the photopolymer material the second time.

8. A method of fabricating a toned pattern on an electrically isolated receiving surface, comprising the steps of:
(a) coating a conductive substrate with a photopolymer material that will undergo an increase in resistivity upon exposure to a source of actinic radiation;
(b) exposing the photopolymer material to actinic radiation a first time to increase the resistivity of the photopolymer material;
(c) forming a permanent latent image on the photopolymer material by selectively exposing portions to a source of actinic radiation to form electrostatically contrasted non-imaged areas and a latent image area, thereby forming an electrostatically imageable surface;
(d) charging the electrostatically imageable surface to form electrostatically contrasted non-imaged areas corresponding to the areas of less electrical resistivity and the latent image area corresponding to the area of higher electrical resistivity.
(e) developing the electrostatic latent image area by applying to the electrostatically imageable surface charged toner particles, the charged toner particles being directed to the latent image area of the electrostatically imageable surface to form a developed latent image;
(f) establishing an electric field between the electrostatically imageable surface and the receiving surface;
(g) placing the receiving surface adjacent to the electrostatically imageable surface;
(h) transferring the developed latent image from the electrostatically imageable surface at a point of transfer to the receiving surface to form non-imaged areas and a transferred toner particle image in an imaged area; and
(i) fusing the transferred toner particle image to the receiving surface.

9. The method according to claim 8 further comprising using a dry film photoresist as the photopolymer material.

10. The method according to claim 8 further comprising using a liquid photoresist as the photopolymer material.

11. The method according to claim 8 further comprising mounting the conductive substrate to a flexible dielectric material.

12. The method according to claim 8 further comprising mounting the conductive substrate to a rigid dielectric material.

13. The method according to claim 8 further comprising increasing the electrical resistivity of the photopolymer to about $10^{13}$ ohm centimeters by the exposure to actinic radiation for the first time.

14. The method according to claim 8 further comprising increasing the electrical resistivity of the photopolymer in the latent image area to about $10^{15}$ to about $10^{16}$ ohm centimeters by the selective exposure of the photopolymer material the second time.

15. The method according to claim 8 further comprising the steps of
(a) etching the non-imaged areas of the conductive surface to remove the receiving surface from the non-imaged areas of the receiving surface; and
(b) removing the toner particles from the imaged area of the receiving surface.

16. The method according to claim 8 further comprising applying to the receiving surface a liquid comprised at least partially of a nonpolar insulating solvent.

17. The method according to claim 8 further comprising maintaining a gap between the receiving surface and the electrostatically imageable surface during transfer of the point of transfer.

18. The method according to claim 8 further comprising using a conductor laminate on which is mounted the receiving surface.

19. The method according to claim 18 further comprising using a conductive receiving surface as the receiving surface.

20. The method according to claim 16 further comprising suspending the charged toner particles in a liquid.

21. The method according to claim 20 further comprising using a liquid comprised at least partially of a nonpolar insulating solvent as the liquid in which the charged toner particles are suspended.

22. A method of making a permanent master with a permanent latent image for use in repeated electrostatic image transfer to receiving surfaces, comprising the steps of:
(a) coating an electrically isolated conductive substrate with a photopolymer material that will undergo an increase in resistivity upon exposure to a source of actinic radiation, thereby forming an electrostatically imageable surface;
(b) forming a permanent latent image in the photopolymer material by exposing selective portions of the photopolymer material to actinic radiation to form non-imaged areas of lesser electrical resistivity and a latent image area of higher electrical resistivity corresponding to the selective portions exposed the second time; and
(c) exposing at least the background or non-imaged areas of the photopolymer material to actinic radiation for a second time to increase the resistivity of the background or non-imaged areas of the photopolymer material;
(d) charging the electrostatically imageable surface to form electrostatically contrasted non-imaged areas and a latent image area corresponding respectively to the non-imaged areas of less electrical resistivity and the latent image area of higher electrical resistivity.

* * * * *